United States Patent
Shiraishi et al.

(10) Patent No.: US 6,703,566 B1
(45) Date of Patent: Mar. 9, 2004

(54) BONDING STRUCTURE FOR A HARD DISK DRIVE SUSPENSION USING ANISOTROPIC CONDUCTIVE FILM

(75) Inventors: Masashi Shiraishi, Tsimshatsui (HK); Ichiro Yagi, Tai Koo Shing (HK)

(73) Assignee: SAE Magnetics (H.K.), Ltd., Kwai Chung (HK)

( * ) Notice: Subject to any disclaimer, the term of this patent is extended or adjusted under 35 U.S.C. 154(b) by 0 days.

(21) Appl. No.: 09/696,276

(22) Filed: Oct. 25, 2000

(51) Int. Cl.[7] .................................................. H05K 1/16
(52) U.S. Cl. ........................ 174/260; 174/254; 174/259; 174/261; 361/760
(58) Field of Search ................. 174/254, 259, 174/250, 255, 260, 261; 361/760

(56) References Cited

U.S. PATENT DOCUMENTS

| | | | |
|---|---|---|---|
| 4,740,657 A | * 4/1988 | Tsukagoshi et al. ...... 174/88 R |
| 5,136,359 A | 8/1992 | Takayama et al. |
| 5,136,365 A | 8/1992 | Pennisi et al. |
| 5,155,301 A | * 10/1992 | Mase ........................ 174/88 R |
| 5,162,087 A | 11/1992 | Fukuzawa et al. |
| 5,188,702 A | 2/1993 | Takayama et al. |
| 5,237,130 A | * 8/1993 | Kulesza et al. ............. 174/260 |
| 5,262,226 A | 11/1993 | Yoshida |
| 5,328,087 A | * 7/1994 | Nelson et al. .............. 228/175 |
| 5,330,684 A | 7/1994 | Emori et al. |
| 5,502,891 A | 4/1996 | Mori et al. |
| 5,604,379 A | 2/1997 | Mori |
| 5,624,268 A | 4/1997 | Maeda et al. |
| 5,625,230 A | * 4/1997 | Park et al. ................... 257/736 |
| 5,679,493 A | 10/1997 | Kai |
| 5,681,647 A | 10/1997 | Caillat |
| 5,710,612 A | 1/1998 | Mase |
| 5,734,523 A | * 3/1998 | Scheidecker et al. ..... 360/234.5 |
| 5,770,305 A | 6/1998 | Terasaka |
| 5,840,215 A | 11/1998 | Tyer et al. |
| 5,873,161 A | * 2/1999 | Chen et al. ................... 29/830 |
| 5,879,530 A | 3/1999 | Caillat |
| 5,918,113 A | 6/1999 | Higashi et al. |
| 5,965,064 A | * 10/1999 | Yamada et al. ............. 252/512 |
| 6,036,813 A | 3/2000 | Schulz et al. |
| 6,098,271 A | * 8/2000 | Yamamoto et al. ...... 29/603.06 |
| 6,232,563 B1 | * 5/2001 | Kim et al. ................... 174/261 |
| 6,259,036 B1 | * 7/2001 | Farnworth ................... 174/260 |
| 6,268,980 B1 | * 7/2001 | Shiraishi et al. ......... 360/234.5 |

* cited by examiner

Primary Examiner—Kamand Cuneo
Assistant Examiner—I B Patel
(74) Attorney, Agent, or Firm—Kenyon & Kenyon

(57) ABSTRACT

A plurality of bonding structures and their forming methods for bonding a FPC to a bonding pad, in particular a bonding pad of a wireless suspension in a head gimbal assembly, using anisotropic conductive adhesive; such structures eliminate the spring-back force in typical anisotropic bonding to ensure durable bonding. At the same time, these structures also allow for reworkability under which the bonded parts can be separated easily.

19 Claims, 7 Drawing Sheets

STRUCTURE OF A CONVENTIONAL FPC CROSS SECTION

CROSS-SECTION OF THE STRUCTURE OF
A SUSPENSION BONDING PAD

USING BONDING TOOL AND HEAT PRESS
MAKE THE DEFORMATION FOR CONTACT

BONDING STRUCTURE FOR A HARD DISK DRIVE SUSPENSION USING ANISOTROPIC CONDUCTIVE FILM

BACKGROUND OF THE INVENTION

This invention generally relates to the field of disk drives, and more particularly to forming optimal structures for bonding in a head gimbal assembly using anisotropic conductive adhesive.

With the rapid progress of miniaturizing and thinning technology for electronic devices, high-density inner wiring systems including flex-print circuit (FPC) have become essential. At the same time, micro-connecting technology for the connection of FPC with other electronic parts, such as the traces on a magnetic head suspension assembly, is indispensable.

Traditionally the FPC is capable of adopting ultrasonic bonding. The connecting terminals of the FPC are plated with gold; the flying leads of the FPC are aligned with and pressed to the bonding pad on the suspension with sufficient force to keep the alignment and atomic interdiffusion of the flying leads and the underlying metallization, which process ensures the intimate contact between the two metal surfaces. However, the pressing of the flying leads of the FPC entails complex processing, and ultrasonic bonding to different bonding pads is very difficult to contact. Moreover, bonded parts cannot be separated in the future to be reworked without damaging the FPC or the suspension.

Alternatively, FPC can be solder-bound using solder bumps produced by, for example, plating processes, for interconnections. However, this process requires forming metal cores and solder bumps for soldering. The metal cores incur extra expenses, and soldering has to be performed at high temperatures typically over 180 degrees Celsius.

Furthermore, both ultrasonic bonding and soldering are becoming increasingly expensive because of high cost of labor and parts of the FPC. There is therefore a need for a bonding method which achieves a stable, reworkable connection without complicated processing.

SUMMARY OF THE INVENTION

The present invention features a novel structure and method for using anisotropic conductive adhesive to bond parts in a head gimbal assembly (HGA) comprising the slider and the FPC.

It is an object of the present invention to overcome the complexities of prior art approaches of ultrasonic bonding and soldering. This invention will alleviate the difficulty of one-time bonding in the case of ultrasonic bonding, and avoid high-temperature bonding required in soldering.

It is another objective of the present invention to reduce the bonding pad size and floating capacity.

Yet another objective of the present invention is to reduce the space between bonding pads to accommodate the trend toward miniaturization of the disk drives and the head assemblies.

A further related objective of the invention is to improve capacity in the bonding process. Reduced sizes of the bonding pads, reduced spacing between the bonding pads, and elimination of additional interconnecting components will contribute to reduce parasitic capacitance. Reduced capacitance will improve the rise and fall time of the electronic signals, thus increase the data rate of the hard disk drive.

In one aspect, the invention relates to adding a conducting structure lodged between the two sections of an overcoat layer of a FPC to enable bonding between the FPC and a contact pad in a HGA using anisotropic conductive adhesive, such as anisotropic conductive film (ACF). The conductive structure can be shaped as a ball and plated with gold, or it can of other types of conductive materials. The overcoat layer may overlap a portion of the top surface of the conductive pad, or the overcoat layer may not touch the conductive pad at all. Alternatively, the conductive structure may be a filler comprising an electrically conductive material completely filling the space between the two sections of the overcoat layer and above the conductive pad. In one implementation, the overcoat layer may comprise one section, or it may be of ultra thinness of less than 10 μm.

In another aspect of the invention, a conductive layer of the FPC may be bound to the contact pad directly by anisotropic conductive adhesive material without an overcoat layer in between.

Other features and advantages of the present invention will become apparent from the following drawings and the detailed description accompanying the drawings.

BRIEF DESCRIPTION OF THE DRAWINGS

Like parts in different drawings are labeled with like numbers.

DESCRIPTION OF THE PREFERRED EMBODIMENT

Figure 1:
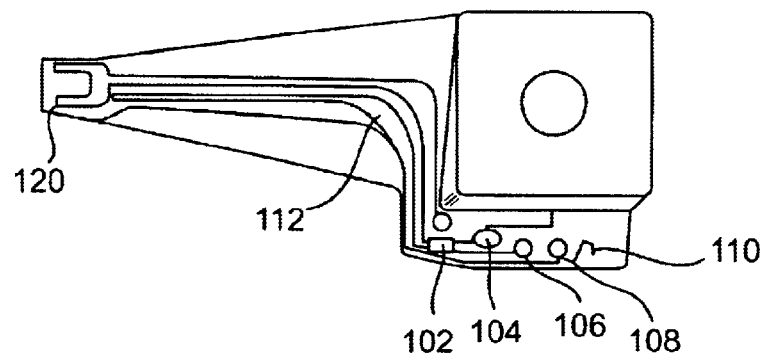
FIG. 1 is a top view of a wireless suspension of a head gimbal assembly.

Referring to FIG. 1, this is a standard wireless suspension. Trace 112 is patterned on top of a flexure piece which runs from slider 120 to bonding pads 102, 104, 106, and 108, transporting electromagnetic signals from slider 120. Base plate 100 supports bonding pads 102, 104, 106, 108, to which a FPC is bonded for transmitting signals to elsewhere in a hard disk drive, such as a circuit on the actuator arm. The number of contact pads shown here is for illustrative purposes only, and there could be more or fewer contact pads without deviating from the spirit of the invention.

Figure 2:
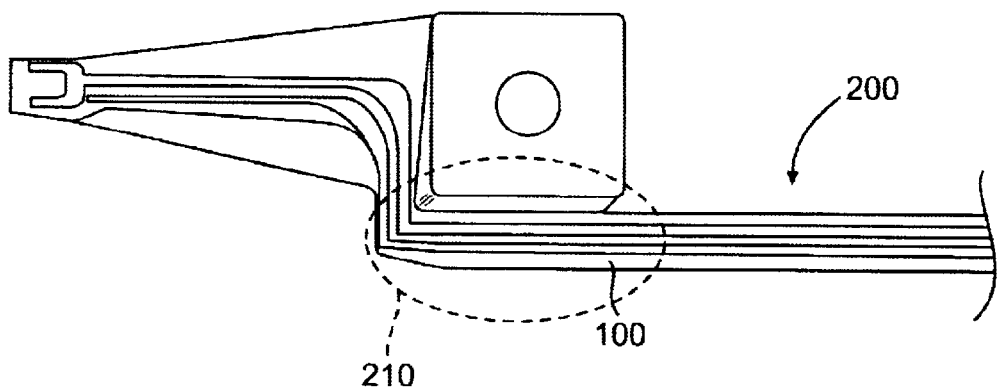
FIG. 2 is a top view of a FPC bound to the wireless suspension of FIG. 1.

Referring to FIG. 2, a FPC 200 is attached to contact pads 102, 104, 106, 108 (not shown) in the circled area 210. Traditionally, FPC can be bound to contact pads using ultrasonic bonding or soldering. With soldering, additional solder bumps need to be incorporated. As mentioned, both prior art bonding methods tend to be cost- and labor-intensive, and bonding using anisotropic conductive adhesive, such as anisotropic conductive film (ACF) CP 9252KS by Sony Corporation of Tokyo, Japan, presents a good alternative.

ACF bonding requires bonding temperature of 150 to 200 Celsius, and a pressure environment of 20 to 40 kg per square centimeters. The bonding time is about 10 to 20 seconds. The process involves cutting the ACF into pieces of desirable size, tacking the pieces unto the surface to be bound, removing the release liner, and bonding under the conditions set out above. ACF bonding also offers the advantage of reworkability. For example, Sony CP9252KS can be reworked by dipping it in acetone for 2 minutes, peeling the ACF, and following up with a Q-tip touch with acetone. ACF bonding also offers good bonding strength. For example, ultrasonic bonding typically offers a bonding strength of about 60 g, comparing with more 130 g for ACF bonding.

Figure 3:
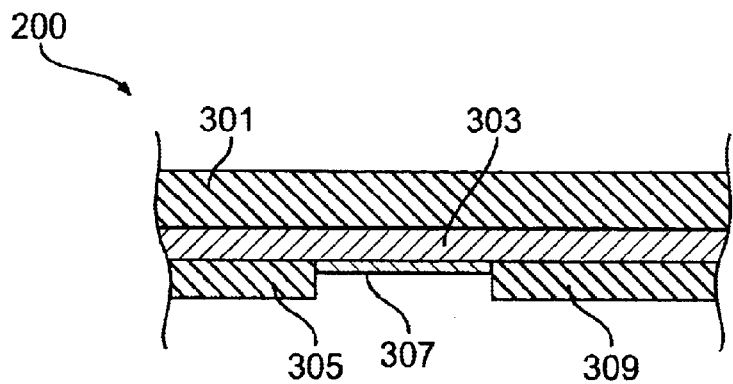
FIG. 3 is cross-sectional view of the structure of a conventional FPC.

Despite the advantages offered by ACF bonding, difficulties remain for applying ACF bonding to a head gimbal assembly. For example, FIG. 3 shows a cross-sectional view of a conventional FPC structure. A conventional FPC 200 usually comprises a base film 301, two sections 305 and 309 of an overcoat layer, with an in-between conductive layer 303 between base film 301 and the overcoat layer. Base film 302 is usually made of insulation material such as polyimide or other types of resin. The sections 305 and 309 of the overcoat layer is made of solder epoxy, photo sensitive solder resist materials, or polyimide film. The conductive layer 303 is usually made of Cu or other similar materials. Between the sections 305 and 309 is the bonding pad surface 307, usually with a plating of Ni with thickness of about 4 μm and a plating of Au with thickness of 1 μm.

Figure 4:
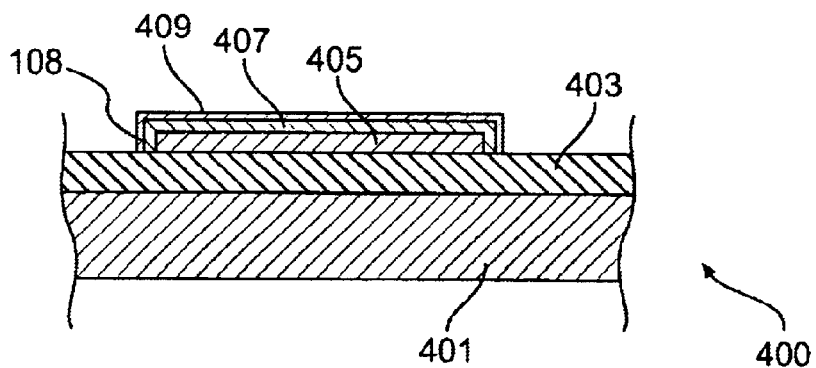
FIG. 4 is a cross-sectional view of the structure of a wireless suspension bonding pad.

FIG. 4 illustrates cross-sectional view of an assembly 400 comprising a wireless suspension bonding pad, such as bonding pad 108 of FIG. 1. Assembly 400 comprises stainless steel base 401, on top of which is an insulating layer 403. Insulating layer 403 can be made of polyimide or other types of insulating resin. Bonding pad 108 is positioned on top of layer 403, and it comprises, in a typical configuration, an electrode 405 made of Cu, followed by a plating 407 of Ni, and finally a plating 409 of gold at the outermost surface of bonding pad 108.

Figure 5A:
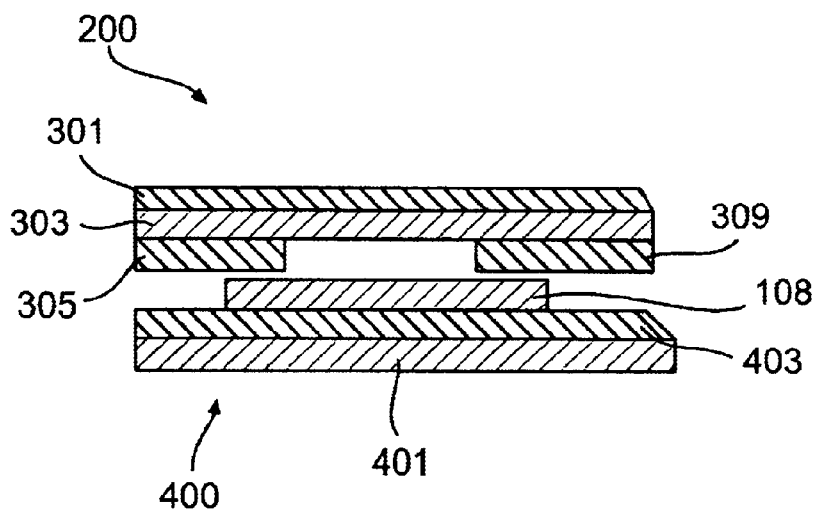
FIG. 5A is a cross-sectional view of the conventional FPC of FIG. 2 positioned on top of the wireless suspension bonding pad of FIG. 4.
Figure 5B:
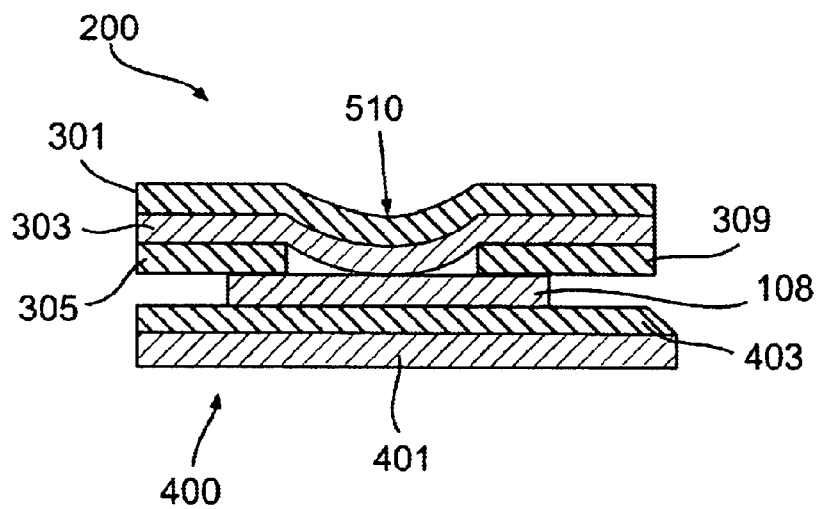
FIG. 5B is a cross-sectional view of the conventional FPC of FIG. 2 bound to the wireless suspension bonding pad of FIG. 4 using anisotropic conductive adhesive.
Figure 5C:
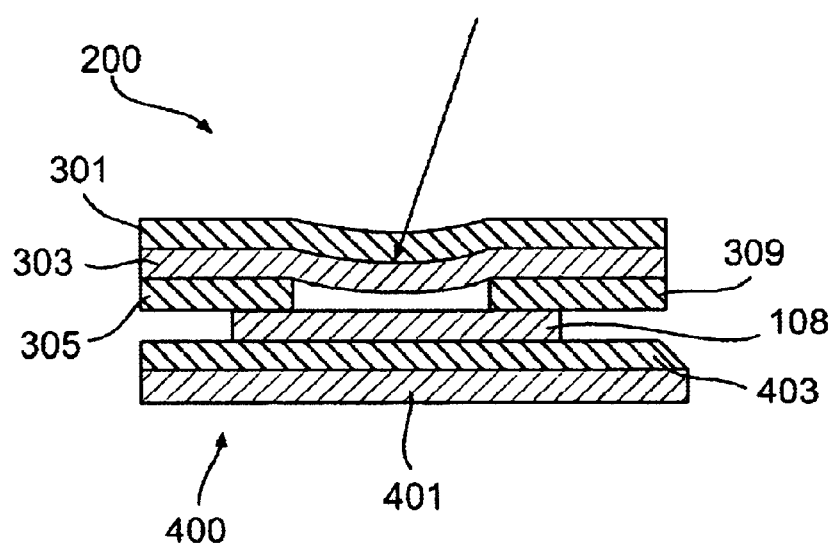
FIG. 5C is a cross-sectional view, after reliability test, of a conventional FPC of FIG. 2 bound to the wireless suspension bonding pad of FIG. 4 using anisotropic conductive adhesive.

FIGS. 5A–5C illustrate some of the problems of using ACF to bond the FPC 200 to the assembly 400. FIG. 5A shows that the FPC 200 is positioned on top of assembly 400, with bottom surfaces of sections 305 and 309 overlapping the two ends of bonding pad 108. When ACF film is heated and applied to bond the two components using bonding tools and processing conditions as set forth above, a deformation 510 in the shape of a bridge is formed to make contact between the FPC 200 and assembly 400, as shown in FIG. 5B. Unfortunately, after reliability test, this deformation 510 tends to revert back to its original condition, causing an open circuit problem, as shown in FIG. 5C. Therefore, several novel bonding structures have been invented to solve this open circuit problem.

Figure 6:
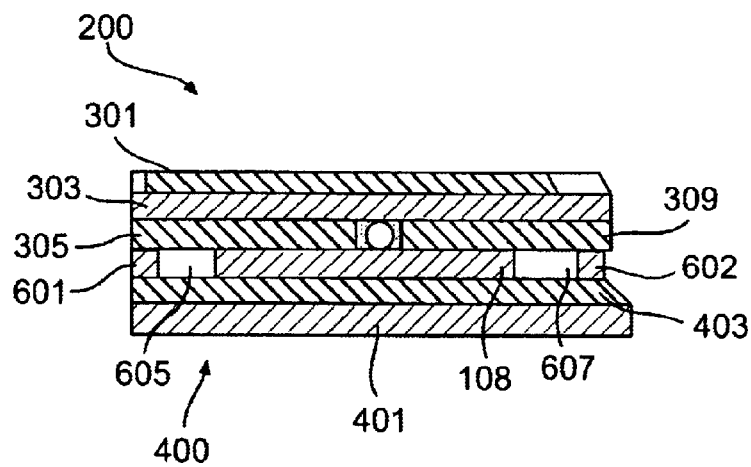
FIG. 6 is a cross-sectional view of a novel bonding structure between a FPC and a wireless suspension using anisotropic conductive adhesive.

Illustrated in FIG. 6 is a ball structure 610 which is placed between the conductive layer 303 and the top surface of bonding pad 108. The ball structure 610 can be made of gold in one implementation, or it can be made of other materials in other implementations of the invention. The ball structure 610 can be formed, in one implementation, with stud bump bonding (SBB) flip chip method or gold ball bonding method commonly known in the art. The space surrounding ball structure 610, as well as space 605 and 607, will be filled with melted/cured ACF used for bonding. The presence of structure 610 prevents the deformation of the FPC, and therefore eliminates the open circuit problem. Typically, for a base film of thickness 23 μm, the conductive layer is about 18 μm, and the overcoat layer about 13 μm. Therefore, the ball structure, or bump 610, has a height of approximately 13 μm. Circuit traces are labeled as 601 and 602 in FIG. 6.

Figure 7:
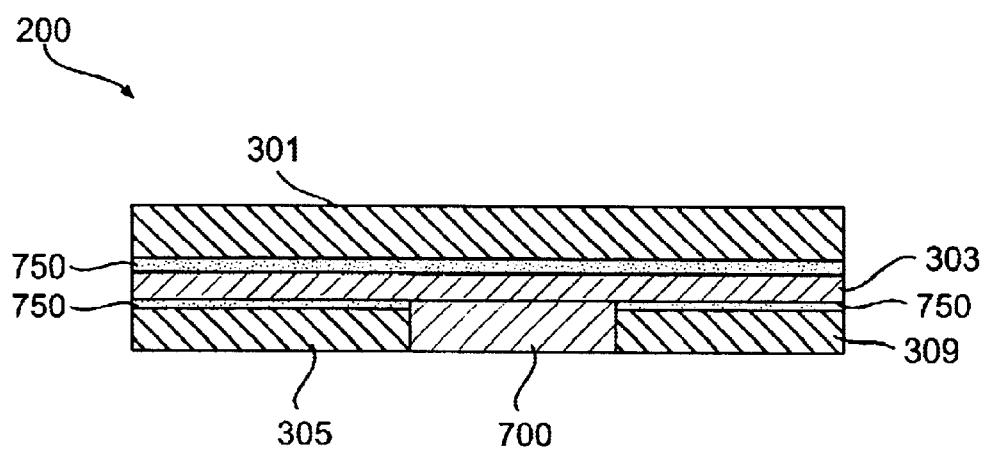
FIG. 7 is a cross-sectional view of a second novel bonding structure of a FPC.

Alternatively, as illustrated in FIG. 7, the complete space formed by the top surface of bonding pad 108 (not shown), the bottom surface of conductive layer 303, and the right wall of overcoat section 305 and overcoat section 309 can be filled with filling materials 700. The thickness of this filling 700 is about 13 μm, and it be made of a number of conductive materials including Ni, Au, or a combination thereof. In other implementations of the invention, the filling 700 can be thicker, thinner, to equal to the thickness of the overcoat layer, ranging between 10 to 38 μm. Using a solid filling 700 will achieve the same objective of eliminating the deformation bridge 510, and thereby preventing the open circuit problem. Note that adhesive layers used in the manufacturing process of FPC 200 may still be present between the base film 301 and conductive layer 303, and/or between conductive layer 303 and overcoat sections 305 and 309.

Figure 8:
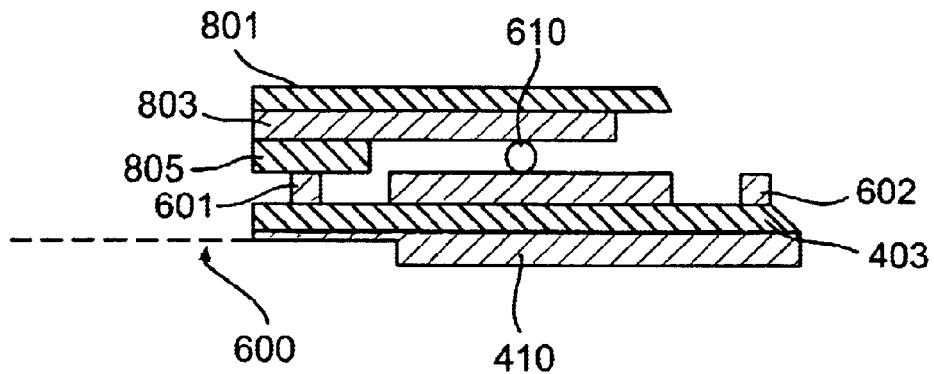
FIG. 8 is a cross-sectional view of a third novel bonding structure between a FPC and a wireless suspension using anisotropic conductive adhesive.

Another implementation of the invention is the removal of one of the two overcoat sections. In this configuration, as illustrated in FIG. 8, ball structure 610 is still present, but the remaining section 805, the conductive layer 803 and the base film 801 are all of shorter length than their counterparts in a FIG. 6. This approach reduces the amount of manufacturing materials required. Melted/cured ACF fills space surrounding ball structure 610 and space 810.

Figure 9:
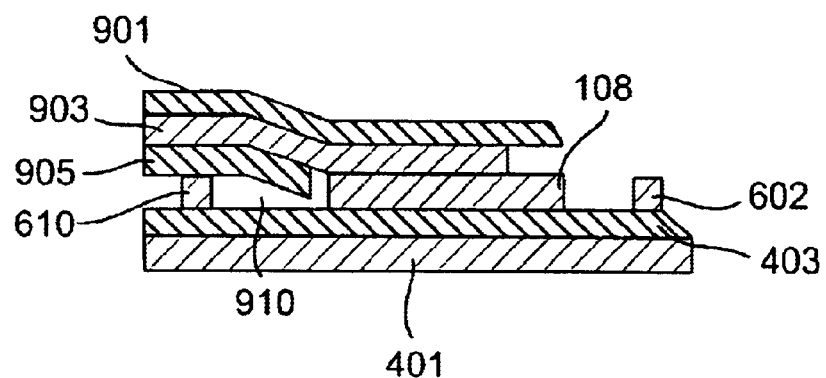
FIG. 9 is a cross-sectional view of a fourth novel bonding structure between a FPC and a wireless suspension using anisotropic conductive adhesive.

FIG. 9 illustrates yet another implementation of the invention. In this configuration, only one of the two sections of overcoat layer is present. The bottom surface of section 905 does not overlap the top surface of bonding pad 108. Furthermore, this configuration does not require ball structure 610. At the same time conductive layer 903 binds to the top surface of bonding pad 108 directly using ACF bonding, but does not overlap the top surface completely. Base film 901 extends beyond the length of bonding pad 108, but stops before reaching circuit trace 602. Eliminating the overcoat layer in a FPC will minimize the open circuit problem; however, overcoat section 905 is needed to prevent the shunting problem around the complicated circuit pattern around the bonding pad. This contrasts with the right hand side of bonding pad 108, where conductive layer 903 does not touch trace 602 because of the absence of an overcoat layer between it and trace 602. Therefore, this configuration presents an optimal compromise between the elimination of the bridge deformation in a FPC inherent in ACF bonding, and the prevention of shunting problem around a bonding pad's complicated circuitry.

Figure 10:
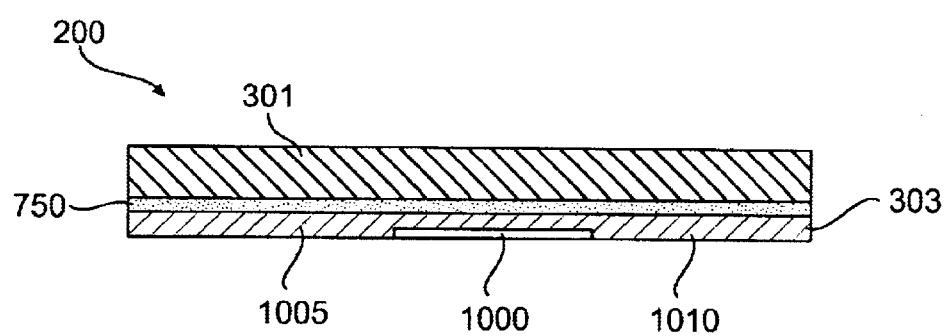
FIG. 10 is a cross-sectional view of a fifth novel bonding structure of a FPC.

FIG. 10 illustrates another novel structure of FPC using ACF bonding. Because, as mentioned above, that it is impossible to eliminate the overcoat layer completely, one solution is to form an ultrathin overcoat layer, such as presented in FIG. 10. Overcoat sections 1005 and 1010 are of less than 10 μm thick. They are think enough to prevent the shunting problem, but thin enough to prevent the formation of a deformation bridge in ACF bonding. Because sections 1005 and 1010 are thin, bonding surface 1000 can bond directly to the top surface of a bonding pad without causing a deformation in base film 301 and conductive layer 303.

The above embodiments of the invention are for illustrative purposes only. Many widely different embodiments of the present invention may be adopted without departing from the spirit and scope of the invention. Those skilled in the art will recognize that the method and structures of the present invention has many applications, and that the present invention is not limited to the specific embodiments described in the specification and should cover conventionally known variations and modifications to the system components described herein.

What is claimed is:

1. A flex-print circuit (FPC) attached to at least one bonding pad on a suspension of a head gimbal assembly in a hard disk drive using anisotropic conductive adhesive, comprising:

a base film;

a conductive layer situated below the base film;

an overcoat layer comprising at least two sections situated below the conductive layer, a bottom surface of each section overlapping partially and pressed onto a top surface of the bonding pad; and a conductive structure forming an electric conduit between the conductive layer and the at least one bonding pad, said anisotropic conductive adhesive being disposed at least partially surrounding the conductive structure for bonding the FPC to the at least one bonding pad.

2. The FPC of claim 1, wherein the conductive structure comprises gold.

3. The FPC of claim 1, wherein the anisotropic conductive adhesive comprises anisotropic conductive film.

4. The FPC of claim 1, wherein the conductive structure comprises a bump having a height of about 12 to 38 μm.

5. The FPC of claim 1, wherein the conductive structure comprises a gold ball.

6. The FPC of claim 1, wherein the anisotropic conductive adhesive and the conductive structure completely occupy a space formed by the at least one bonding pad, the conductive layer, and the at least two sections of the overcoat layer.

7. A flex-print circuit (FPC) attached to a bonding pad comprising:

a conductive layer, in said flex print circuit, bonded to the bonding pad using anisotropic conductive adhesive;

an overcoat layer positioned below the conductive layer and pressed on to a top surface of the bonding pad; and a conductive bump lodged between the conductive layer and the bonding pad.

8. The FPC of claim 7, wherein the conductive bump comprises gold.

9. The FPC of claim 7, wherein the overcoat layer comprises two sections separated by a plating of conductive material, each of said two sections overlapping an end of a top surface of the bonding pad.

10. The FPC of claim 7, wherein the overcoat layer does not overlap the bonding pad.

11. The FPC of claim 7, wherein the anisotropic conductive adhesive comprises anisotropic film.

12. A bonding device adapted for attachment to a bonding pad with an anisotropic conductive adhesive, the bonding device comprising:

a base film;

a conductive layer having a first side and a second side wherein a first side of the conductive layer is attached to the base film;

an overcoat layer attached to a first portion of a second side of the conductive layer; and a conductive element attached to a second portion of the second side of the conductive layer wherein the conductive element is adapted to form an electrical conduit between the conductive layer and the attached bonding pad, and the overcoat layer is to press against said bonding pad.

13. A bonding device according to claim 12 wherein the overcoat layer comprises at least two sections arranged on the second side of the conductive layer such that a portion of each of the two sections overlap a portion of the bonding pad when the bonding device is attached to the bonding pad.

14. A bonding device according to claim 12 wherein the anisotropic conductive adhesive surround the conductive element when the bonding device is attached to the bonding pad.

15. A bonding device according to claim 12 wherein conductive element comprises gold.

16. A bonding device according to claim 12 wherein the anisotropic conductive adhesive comprises anisotropic conductive film.

17. A bonding device according to claim 12 wherein the conductive element comprises a bump having a height of about 12 to 38 μm.

18. A bonding device according to claim 12 wherein the conductive element comprises a gold ball.

19. A bonding device according to claim 12 wherein the the anisotropic conductive adhesive and the conductive element completely occupies a space formed by the bonding pad, the conductive layer, and the overcoat layer when the bonding device is attached to the bonding pad.

* * * * *